(12) United States Patent
Shih et al.

(10) Patent No.: US 8,363,007 B2
(45) Date of Patent: Jan. 29, 2013

(54) METHOD AND TOUCHPAD INTERFACE DEVICE USING LIGHT FOR DISPLAYING LEVEL

(75) Inventors: Hung-Wu Shih, Tapei Hsien (TW);
Hao-Sheng Lo, Tapei Hsien (TW);
Hsueh-Chih Peng, Tapei Hsien (TW);
Tsan-Sheng Chen, Tapei Hsien (TW);
Yan-Lin Kuo, Tapei Hsien (TW)

(73) Assignee: Acer Inc., Taipei Hsien (TW)

( * ) Notice: Subject to any disclaimer, the term of this patent is extended or adjusted under 35 U.S.C. 154(b) by 1119 days.

(21) Appl. No.: 12/265,782

(22) Filed: Nov. 6, 2008

(65) Prior Publication Data

US 2009/0160671 A1    Jun. 25, 2009

(30) Foreign Application Priority Data

Dec. 25, 2007  (TW) ............................... 96150047 A
Apr. 30, 2008  (TW) ............................... 97115838 A

(51) Int. Cl.
*G09G 5/00*         (2006.01)
(52) U.S. Cl. ...................... 345/156; 178/18.01; 345/173
(58) Field of Classification Search .... 178/18.01–18.11; 345/156–184; 340/407.1, 407.2, 815.4, 815.42, 340/815.43, 815.45, 815.47, 815.48, 815.5; 341/21–35
See application file for complete search history.

(56) References Cited

U.S. PATENT DOCUMENTS

| | | | |
|---|---|---|---|
| 4,121,204 A * | 10/1978 | Welch et al. ................... | 345/174 |
| 5,469,194 A * | 11/1995 | Clark et al. .................... | 345/173 |
| 6,639,584 B1 | 10/2003 | Li | |
| 2003/0019734 A1* | 1/2003 | Sato et al. ...................... | 200/317 |
| 2004/0207605 A1* | 10/2004 | Mackey et al. ................ | 345/173 |
| 2007/0152977 A1* | 7/2007 | Ng et al. ........................ | 345/173 |
| 2007/0152983 A1 | 7/2007 | McKillop et al. | |
| 2008/0084397 A1* | 4/2008 | On et al. ........................ | 345/173 |
| 2008/0230283 A1* | 9/2008 | Yoon et al. ................. | 178/18.11 |
| 2009/0090568 A1 | 4/2009 | Min | |

* cited by examiner

*Primary Examiner* — Amare Mengistu
*Assistant Examiner* — Koosha Sharifi-Tafreshi
(74) *Attorney, Agent, or Firm* — Alan Kamrath; Kamrath IP Lawfirm, P.A.

(57) ABSTRACT

A touchpad interface device includes a sensing board, a light guide plate, a control panel, and a plurality of lighting elements. The control panel includes a plurality of transparent areas and a plurality of covering areas to form a plurality of patterns. Users can understand the operating functionality of the control panel according to the plurality of patterns. The plurality of patterns includes a plurality of scale patterns, and the plurality of scale patterns have a volume adjusting area. The plurality of light members is located under the control panel and corresponding to the volume adjusting area. When the plurality of lighting elements illuminate, the scale patterns at the corresponding position are illuminated.

19 Claims, 17 Drawing Sheets

METHOD AND TOUCHPAD INTERFACE DEVICE USING LIGHT FOR DISPLAYING LEVEL

BACKGROUND OF THE INVENTION

1. Field of the Invention

The present invention relates to a touchpad interface device, and, more particularly, to a touchpad interface device disposed next to a keyboard of a portable computer.

2. Description of the Related Art

The manufacturing technology of touchpad devices has improved rapidly these few years. The performance and quality of the products have improved too, and the price has been reduced. Therefore, various touchpad devices have become more and more popular.

Generally, touchpad devices can be divided into three types: capacitive touchpads, resistive touchpads, and electromagnetic touchpads. These different touchpad devices have their own benefits and drawbacks, and capacitive touchpads are more suitable for portable computers.

U.S. Pat. No. 6,639,584 "Methods and Apparatus For Controlling A Portable Electronic Device Using A Touchpad" discloses a similar technology.

Some products have some figures or text print on the touchpad so that users can be aware of specific functionalities.

Furthermore, some mobile phone keyboards have lighting effects for decorative purposes.

Therefore, it is desirable to provide a method and a touchpad interface device using light for displaying level to mitigate and/or obviate the aforementioned problems.

SUMMARY OF THE INVENTION

A main objective of the present invention is to provide a method and a touchpad interface device using light for displaying level, which can help users operate the application software in the computer.

Another objective of the present invention is to provide a method and a touchpad interface device using light for displaying level, which can help the user know the current volume level.

In order to achieve the above-mentioned objectives, the touchpad interface device of the present invention comprises a sensing board, a light guide plate, a control panel, and a plurality of lighting elements.

The control panel has a plurality of transparent areas and a plurality of covering areas forming a plurality of patterns, such that the user can understand the operating functionality of the control panel according to the plurality of patterns. The plurality of pattern comprises a plurality of scale patterns, and the plurality of scale patterns comprises a volume adjusting area.

The sensing board is disposed under the control panel for sensing physical contact. The sensing board has a volume adjustment sensing area corresponding to the position of the volume adjusting area.

The plurality of lighting elements are disposed under the control panel and at a position corresponding to the volume adjusting area. When the lighting elements illuminate, the scale patterns at the corresponding position are illuminated.

Furthermore, when the user touches the volume adjusting area, the volume adjustment sensing area is activated to control the brightness of the lighting element such that the plurality of scale patterns are illuminated. More scale patterns being illuminated indicates the volume is at a higher level, and the user is made aware of the level of the volume by the brightness of the scale pattern.

Other objectives, advantages, and novel features of the invention will become more apparent from the following detailed description when taken in conjunction with the accompanying drawings.

DETAILED DESCRIPTION OF THE PREFERRED EMBODIMENTS

Figure 1:
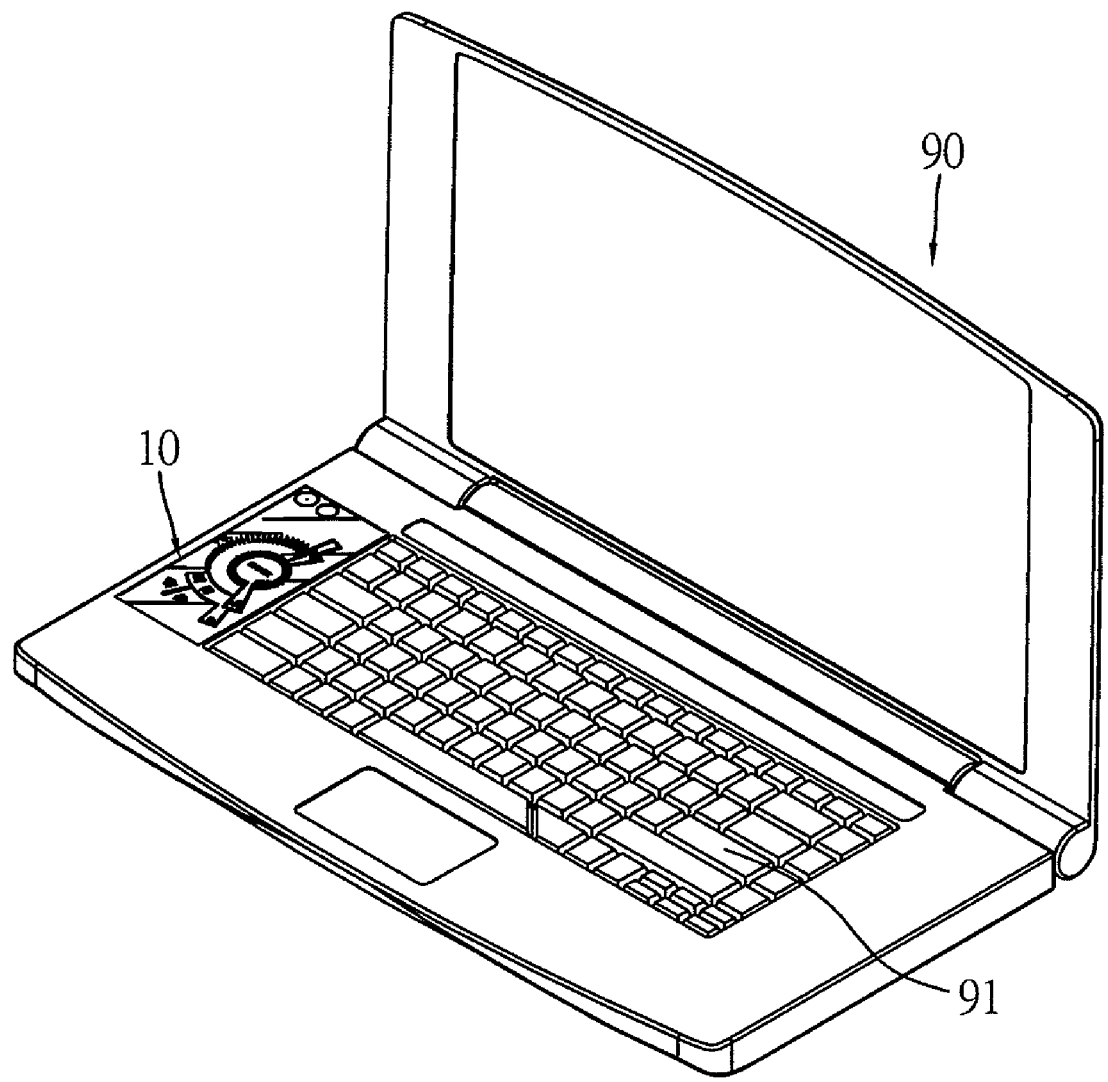
FIG. 1 is a schematic drawing of a touchpad interface device installed in a portable computer according to the present invention.
Figure 1A:
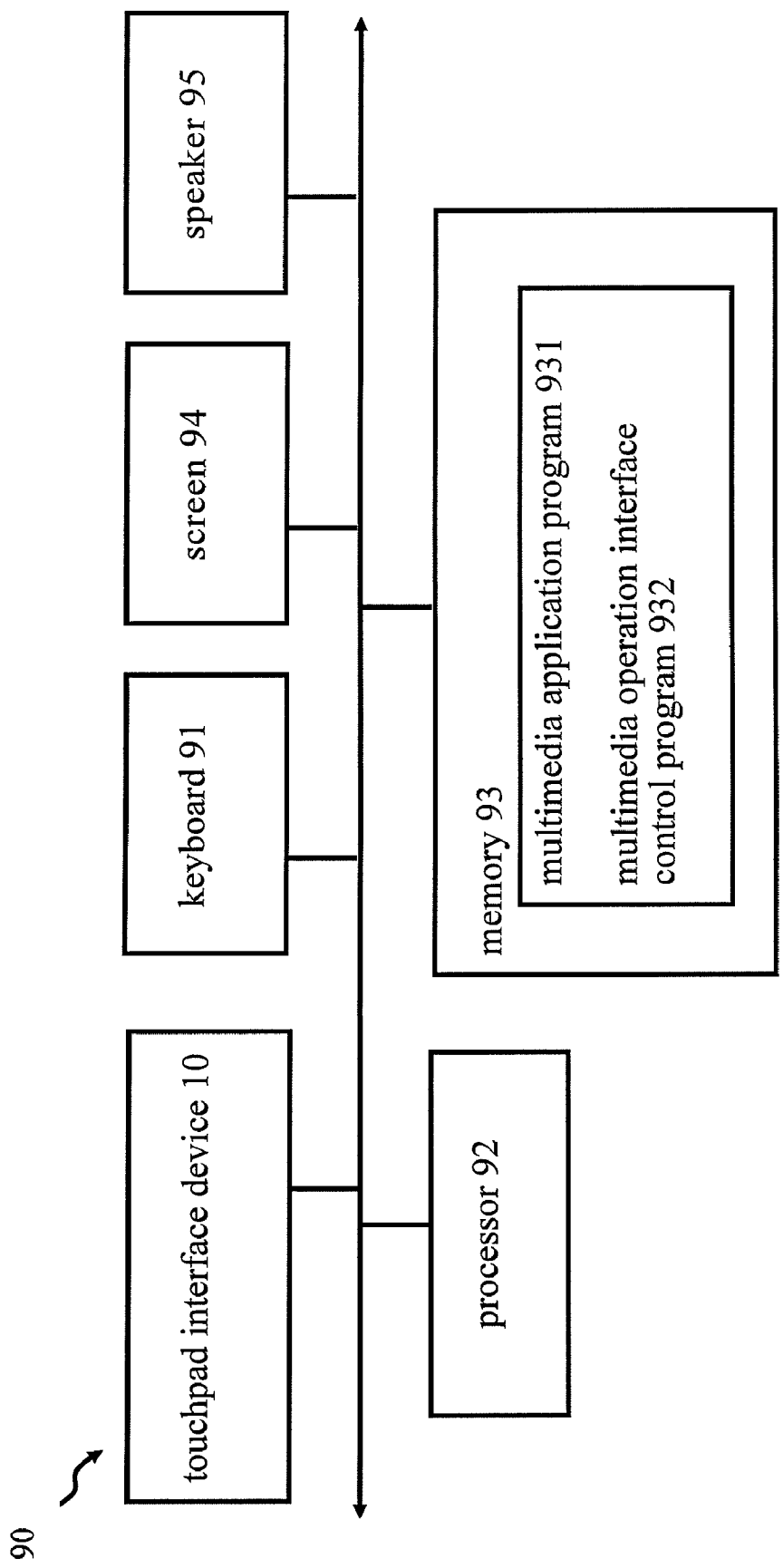
FIG. 1A is a hardware structure drawing of the portable computer.

Please refer to FIG. 1. A touchpad interface device 10 is installed next to a keyboard 91 of a portable computer 90. Please refer to FIG. 1A. The portable computer 90 comprises the keyboard 91, a processor 92, a memory 93 (such as DRAM, a hard disk, or an optical disk), a screen 94, and a speaker 95. The memory 93 has system programs and a multimedia application program 931 (such as mp3, mp4 player programs) and a multimedia operation interface control program 932. The touchpad interface device 10 of the present invention is used for operating the multimedia operation interface control program 932 to control the multimedia application program 931.

Figure 2:
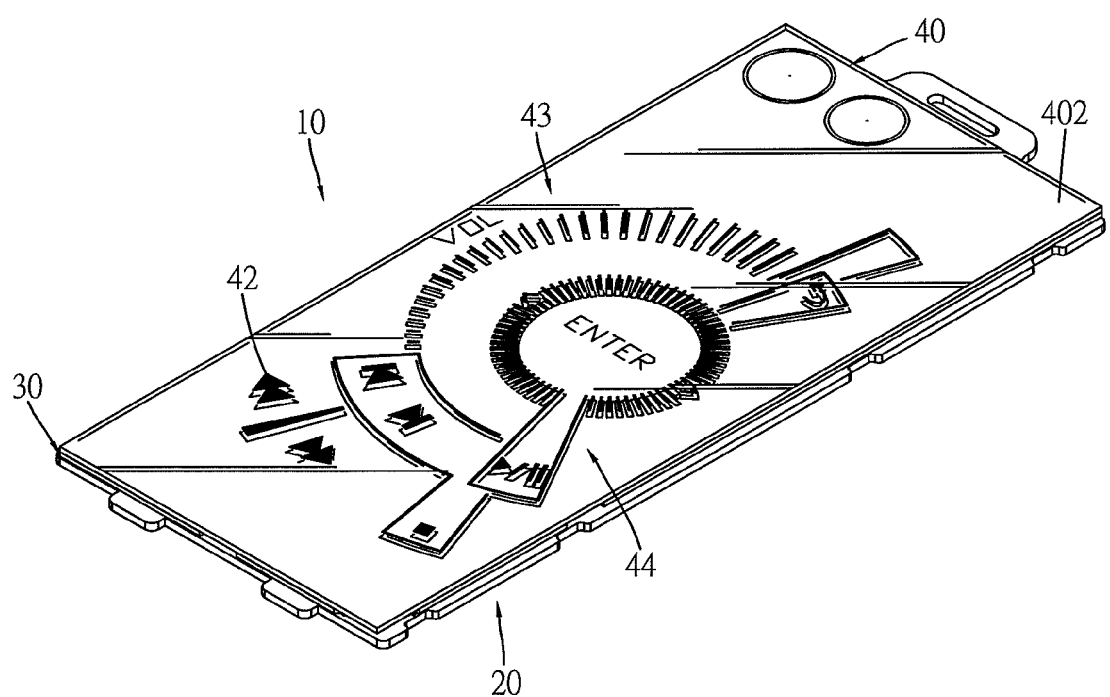
FIG. 2 is a three-dimensional drawing of the touchpad interface device according to the present invention.
Figure 3:
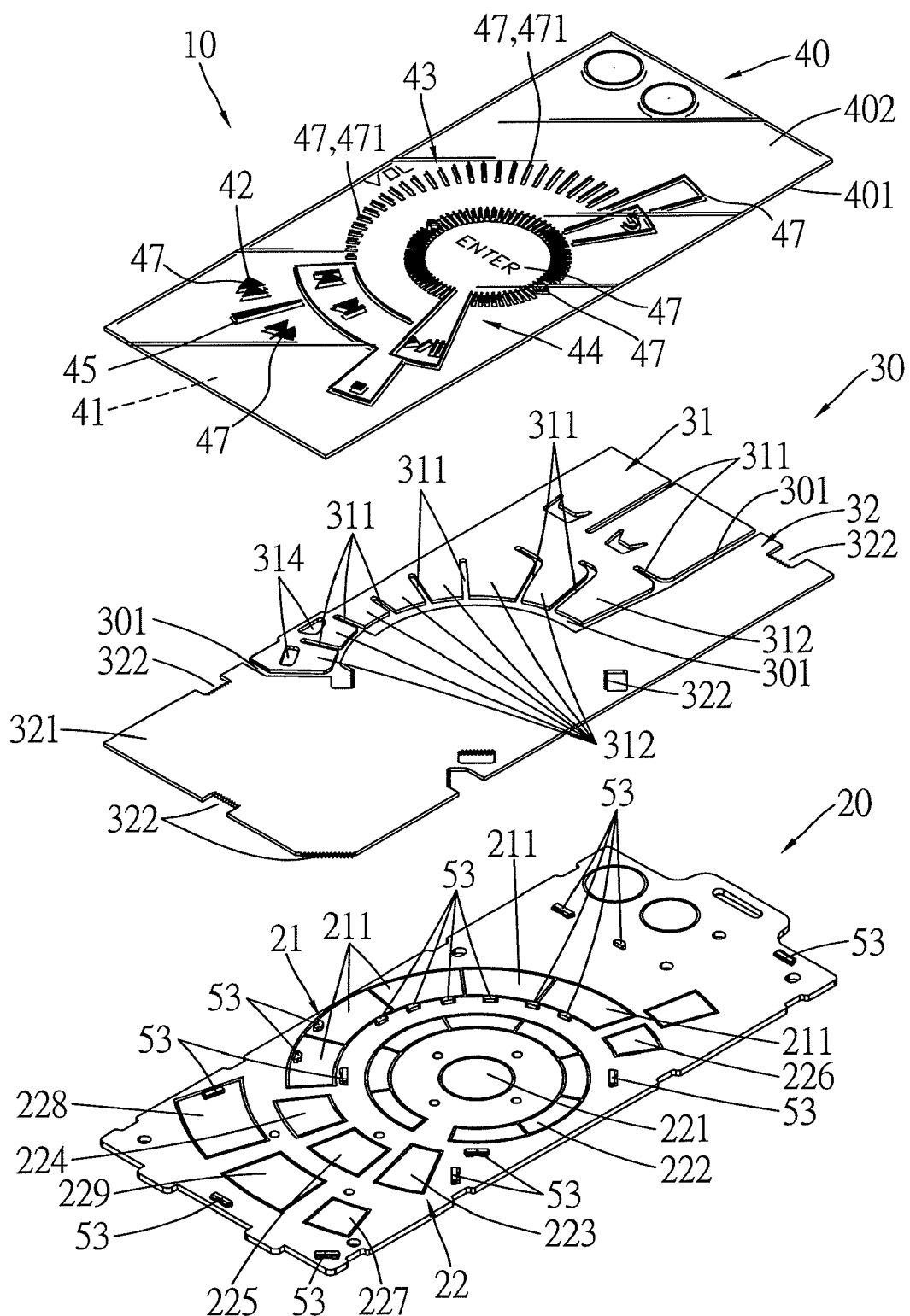
FIG. 3 is a three-dimensional exploding drawing of the touchpad interface device according to the present invention.
Figure 4:
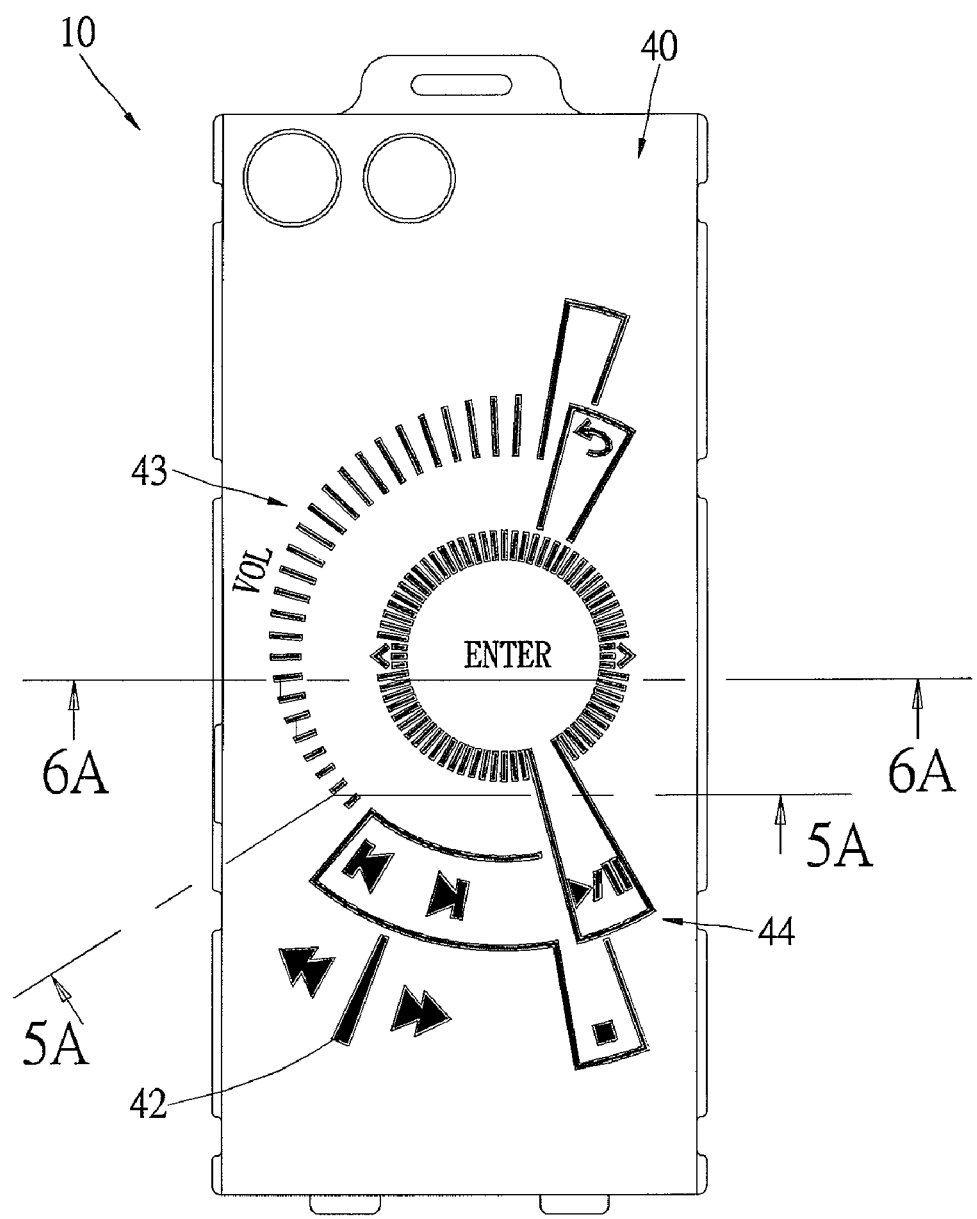
FIG. 4 is a top view of the touchpad interface device according to the present invention.

As shown in FIG. 2 to FIG. 4, the touchpad interface device 10 comprises a sensing board 20, a light guide plate 30, a control panel 40, and a plurality of lighting elements 53.

The sensing board 20 has a volume adjustment sensing area 21 for the user to adjust a media volume level and a player control sensing area 22 for the user to control the media play execution. In this embodiment, the volume adjustment sensing area 21 has several volume sensing areas 211, which individually process an input value from zero to a specific amount. As shown in the drawing, the volume adjustment sensing area 21 has five volume sensing areas 211, which process input values from zero to four and their respective volume control percentages 0%, 25%, 50%, 75%, and 100%. Furthermore, the player control sensing area 22 has a media play execution sensing area 221 disposed at the center of the arc-shaped volume adjustment sensing area 21, and eight option sensing areas 222 (used for such functions as selecting image files or multimedia programs) arranged in a ring shape and disposed between the media play execution sensing area 221 and the volume sensing area 211. Moreover, the player control sensing area 22 has a play/pause sensing area 223, a previous one sensing area 224, a next one sensing area 225, and a repeat sensing area 226, all disposed at the same radius distance from the volume sensing area 211. The player control sensing area 22 has a stop sensing area 227, a fast rewind sensing area 228, and a fast forward sensing area 229 in its very outer circle. The arrangement of the volume adjustment sensing area 21 and the player control sensing area 22 can be various.

More important, all sensing areas (the volume sensing area 211, the option sensing area 222, etc.) divided on the sensing board 20 can also be identified by the coordinate position of the physical contact on the sensing board 20, and the corresponding coordinate position indicates the related functionality.

The light guide plate 30 is disposed on the sensing board 20 and used for the purpose of emitting light evenly. The light guide plate 30 comprises a first light guide plate 31 and a second light guide plate 32. The first light guide plate 31 is disposed above the volume adjustment sensing area 21 of the sensing board 20, and the second light guide plate 32 is disposed above the player control sensing area 22 of the sensing board 20. Furthermore, a gap 301 exists between the first light guide plate 31 and the second light guide plate 32 to prevent light interference.

Figure 5A:
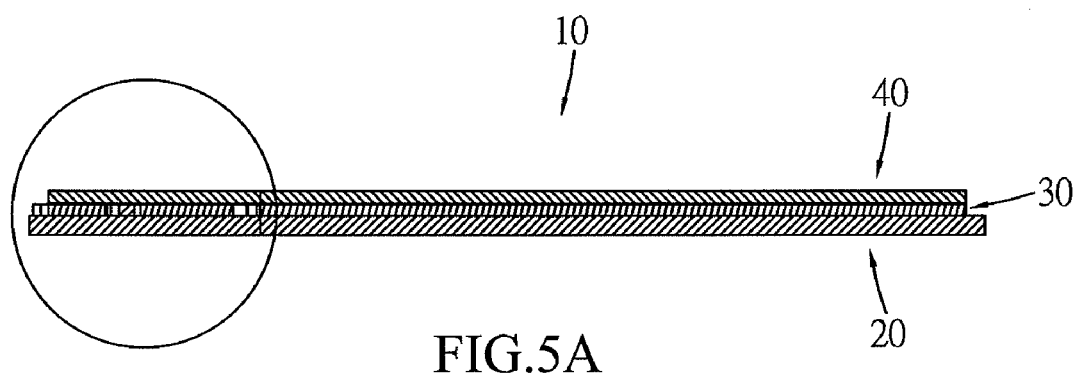
FIG. 5A is a cross-sectional drawing along line 5A-5A shown in FIG. 4 according to the present invention.
Figure 5B:
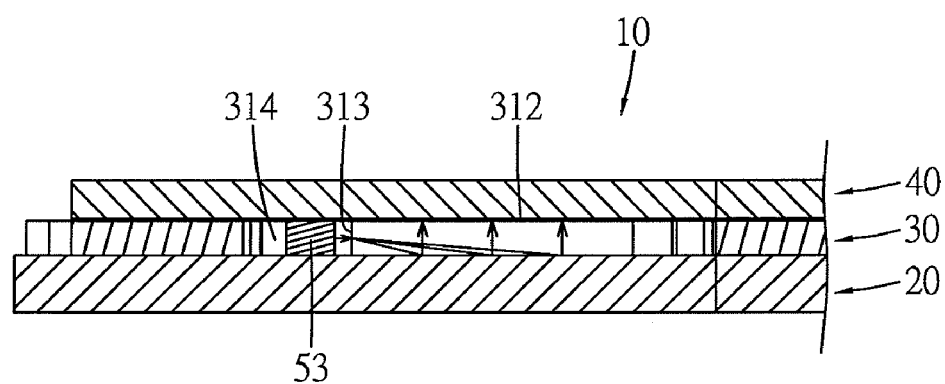
FIG. 5B is an enlargement of the region circled in FIG. 5A.
Figure 6A:
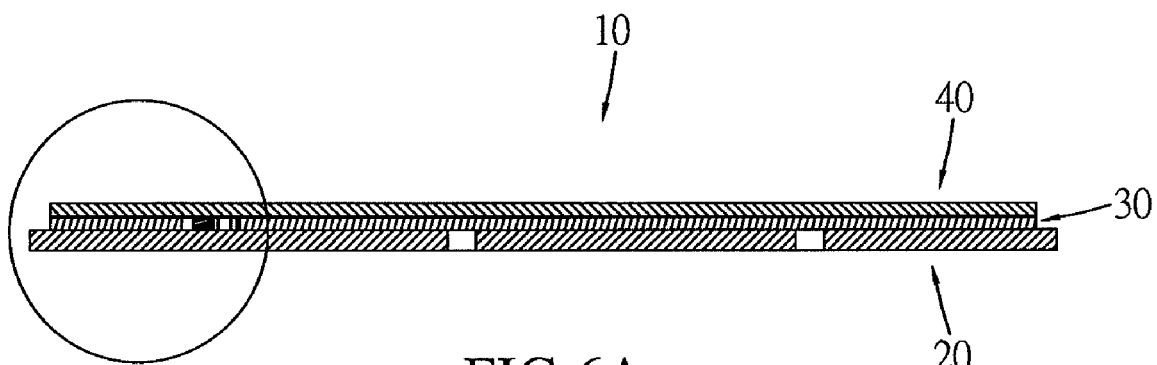
FIG. 6A is a cross-sectional drawing along line 6A-6A shown in FIG. 4 according to the present invention.
Figure 6B:
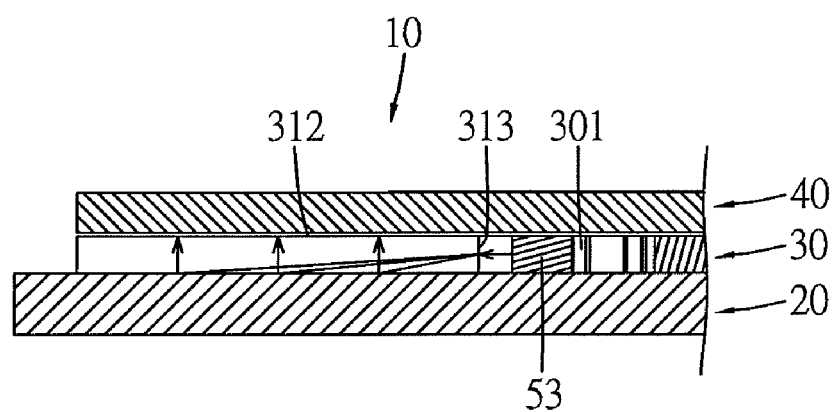
FIG. 6B is an enlargement of the region circled in FIG. 6A.

The first light guide plate 31 has a plurality of interference slits 311 at the position corresponding to the volume adjustment sensing area 21 of the sensing board 20 to form several individual light emitting faces 312. The first light guide plate 31 has a light introducing face 313 corresponding to each lighting element 53. As shown in FIG. 5 and FIG. 6, these light introducing faces 313 are used for receiving the light transmitted from the lighting elements 53 and reflecting it, and the light is then emitted evenly through each individual light emitting face 312. In this embodiment, the first light guide plate 31 has eight light emitting faces 312 at the position corresponding to the volume adjustment sensing area 21 of the sensing board 20. Therefore, each lighting element 53 corresponding to the individual light introducing face 313 can be controlled by different volume sensing areas 211 and illuminate simultaneously.

The top of the second light guide plate 32 forms a light emitting face 321, and the second light guide plate 32 has a tooth-shaped light introducing face 322 corresponding to each lighting element 53. The light introducing face 322 of the second light guide plate 32 receives the light transmitted from the lighting elements 53 and reflects it, and the light is then emitted through the light emitting face 321 of the second light guide plate 32. These lighting elements 53 can be light-emitting diodes (LED), and the color of the light from the lighting elements 53 of the first light guide plate 31 can be different from the color of the light from the lighting elements 53 of the second light guide plate 32. Thus, the first and second light guide plates 31, 32 can emit lights of different colors.

Moreover, if the lighting elements 53 need to be placed deeper in the light guide plate 30, some lighting elements 53 can be placed in the gap 301, or a plurality of containing slots 314 can be disposed on the light guide plate 30 for placing the lighting elements 53.

Figure 3A:
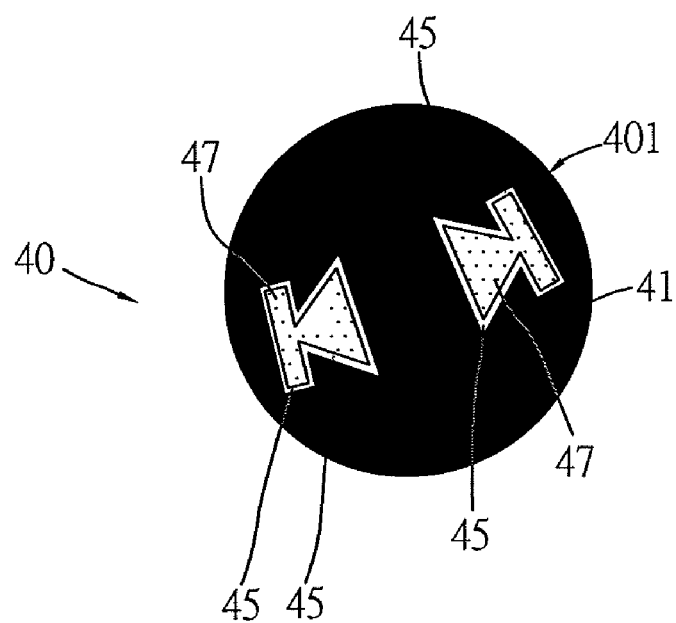
FIG. 3A shows a partial area of an inner surface of a control panel according to the present invention.
Figure 3B:
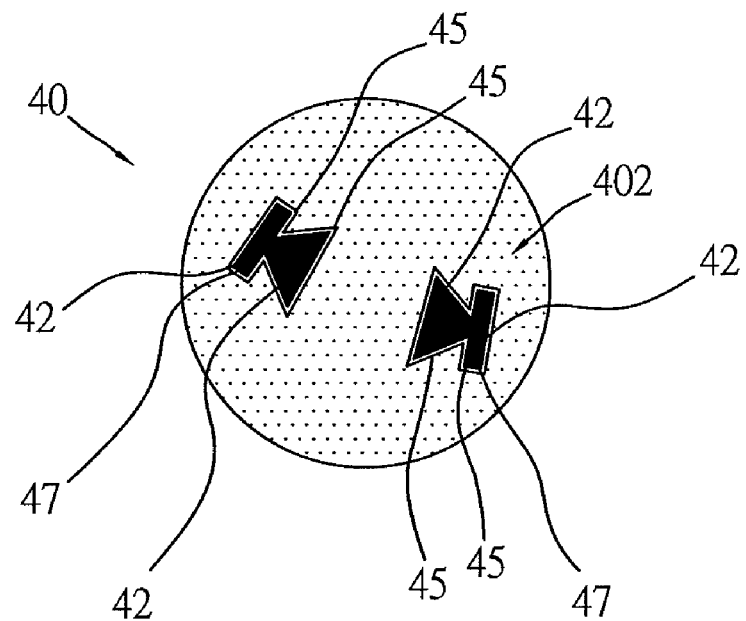
FIG. 3B shows a partial area of an outer surface of the control panel according to the present invention.

Please refer to FIG. 3A and FIG. 3B. The control panel 40 is a flat panel and disposed on the light guide plate 30. The control panel 40 has an inner surface 401 and an outer surface 402. The inner surface 401 has a first cover layer (covering area) 41, and the first cover layer 41 is non-translucent. The first cover layer 41 can be paint material which is attached to the inner surface 401 of the control panel 40 by being painted or plated.

The first cover layer 41 has more than one transparent area 45, and the transparent areas 45 are arranged to form a pattern 47 (such as letters, symbols, or figures) required by the customer.

A projected image of the transparent areas 45 and the first cover layer 41 is formed on the outer surface 402 of the control panel 40. Substantially, the transparent area 45 has a smooth surface as the inner surface of the control panel 40, so the light transmitted from the light guide plate 30 can enter into the control panel 40 via the inner surface 401.

The outer surface 402 of the control panel 40 individually has a plurality of second cover layers (covering area) 42 corresponding to the projected image area of the transparent areas 45, and the second cover layer 42 is used for isolating the light from entering the control panel 40 via the transparent areas 45. The second cover layer 42 can be paint material which is attached to the outer surface 402 of the control panel 40 by being painted or plated. The size of the second cover layer 42 is smaller than the pattern 47 of the transparent areas 45.

Because the size of the second cover layer 42 (e.g. a symbol or pattern) is smaller than the pattern 47 of the transparent areas 45, a double-layered pattern 47 is formed by the second cover layer 42 and transparent areas 45 such that the light is transmitted from the outer surface 402 of the control panel 40 via the transparent areas 45 to form the protruding pattern 47 with a three dimensional visual effect.

The control panel 40 utilizes the functional pattern 47 formed by the first cover layer 41 and the second cover layer 42 to provide a volume adjusting area 43 and a player control area 44 for the user. In this embodiment, the volume adjusting area 43 is used for enabling the user to adjust the volume. The volume adjusting area 43 of the control panel 40 is disposed on the volume adjustment sensing area 21 of the sensing board 20, and the plurality of patterns 47 on the volume adjusting area 43 has a plurality of scale patterns 471 (such as small bar-shaped blocks). The plurality of scale patterns 471 are aligned continuously and in an arc-shaped radiant arrangement, and are disposed at the positions corresponding to the light emitting face 312 of the first light guide plate 31. Furthermore, the player control area 44 of the control panel 40 has different functional patterns 47 at the positions corresponding to the different sensing areas of the player control sensing area 22 of the sensing board 20. When the user touches the volume adjusting area 43 or the player control area 44 of the control panel 40, the corresponding volume adjustment sensing area 21 or the player control sensing area 22 of the sensing board 20 receives a signal to control the execution of the media and generate a visual effect on the control panel 40 at the same time.

Figure 7:
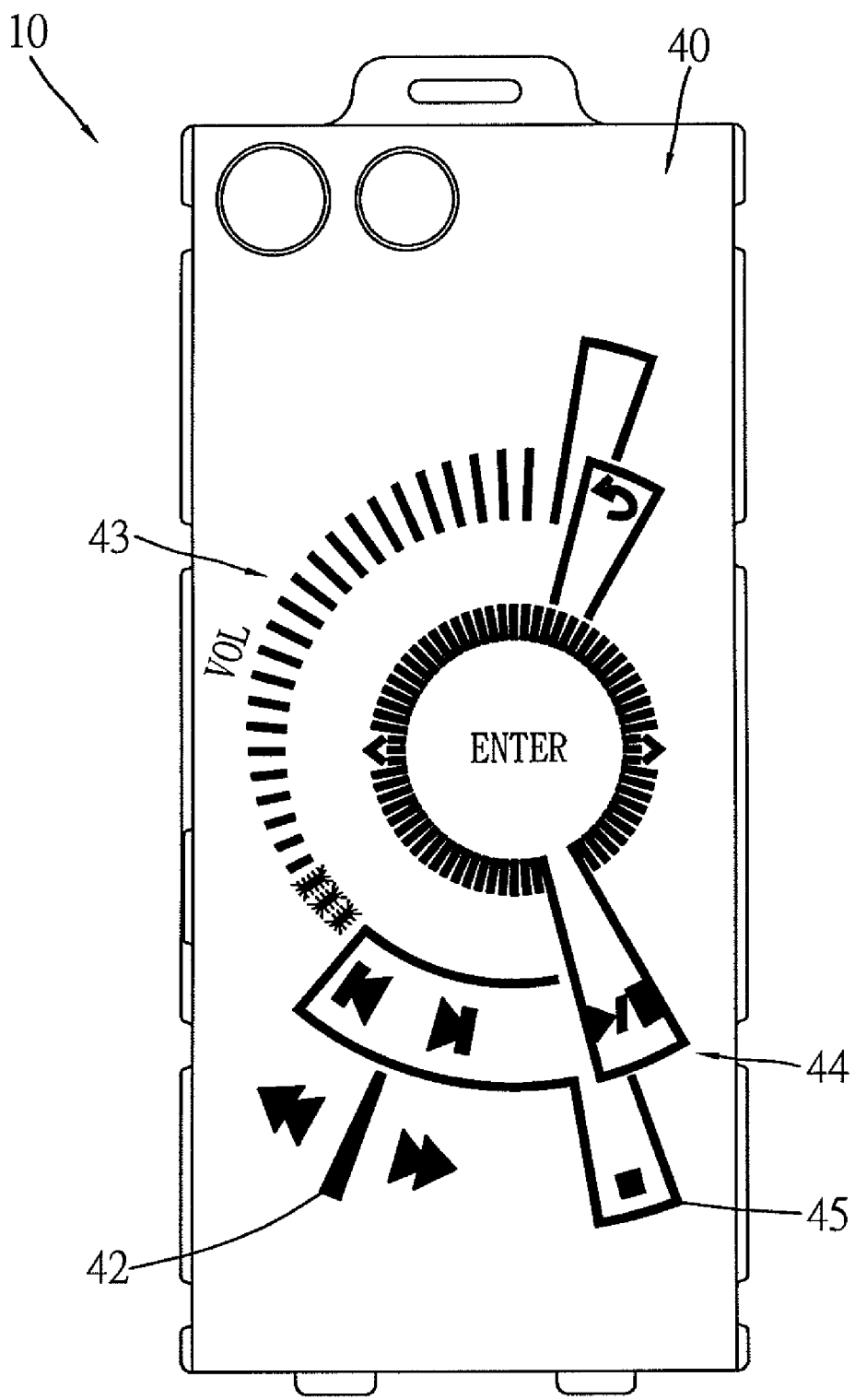
FIG. 7 is a top view drawing of the touchpad interface device according to the present invention.
Figure 8:
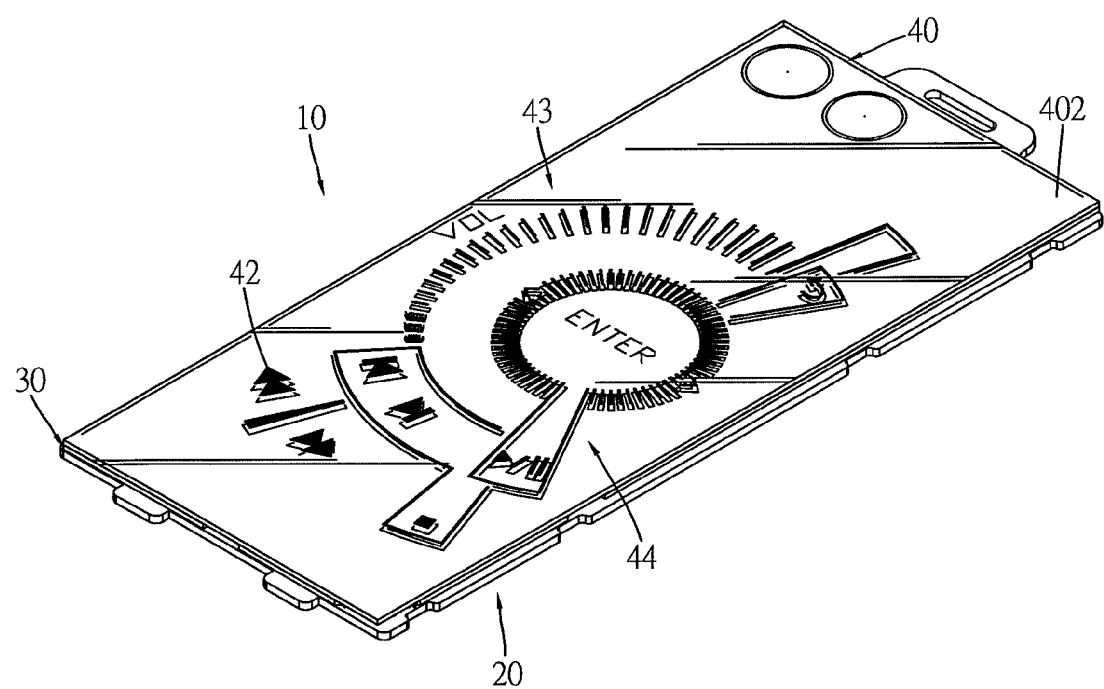
FIG. 8 is another three-dimensional drawing of the touchpad interface device according to the present invention.

When the user first turns on the touchpad interface device 10, all lighting elements 53 in the player control sensing area 22 transmit light to the second light guide plate 32, so the player control area 44 of the control panel 40 generates a three dimensional visual effect and provides functional options for the user to operate the media. As for the lighting elements 53 in the volume adjustment sensing area 21, only the lighting element 53 corresponding to the volume sensing area which has an input value of 0 illuminates light, which makes the light emitting face 312 corresponding to the first light guide plate 31 emit light such that only part of the volume adjusting area 43 of the control panel 40 has a three dimensional visual effect, as shown in FIG. 7 and FIG. 8.

Please refer to FIGS. 9 to 13, related to how the user would adjust the volume level via the volume adjusting area 43.

Figure 9:
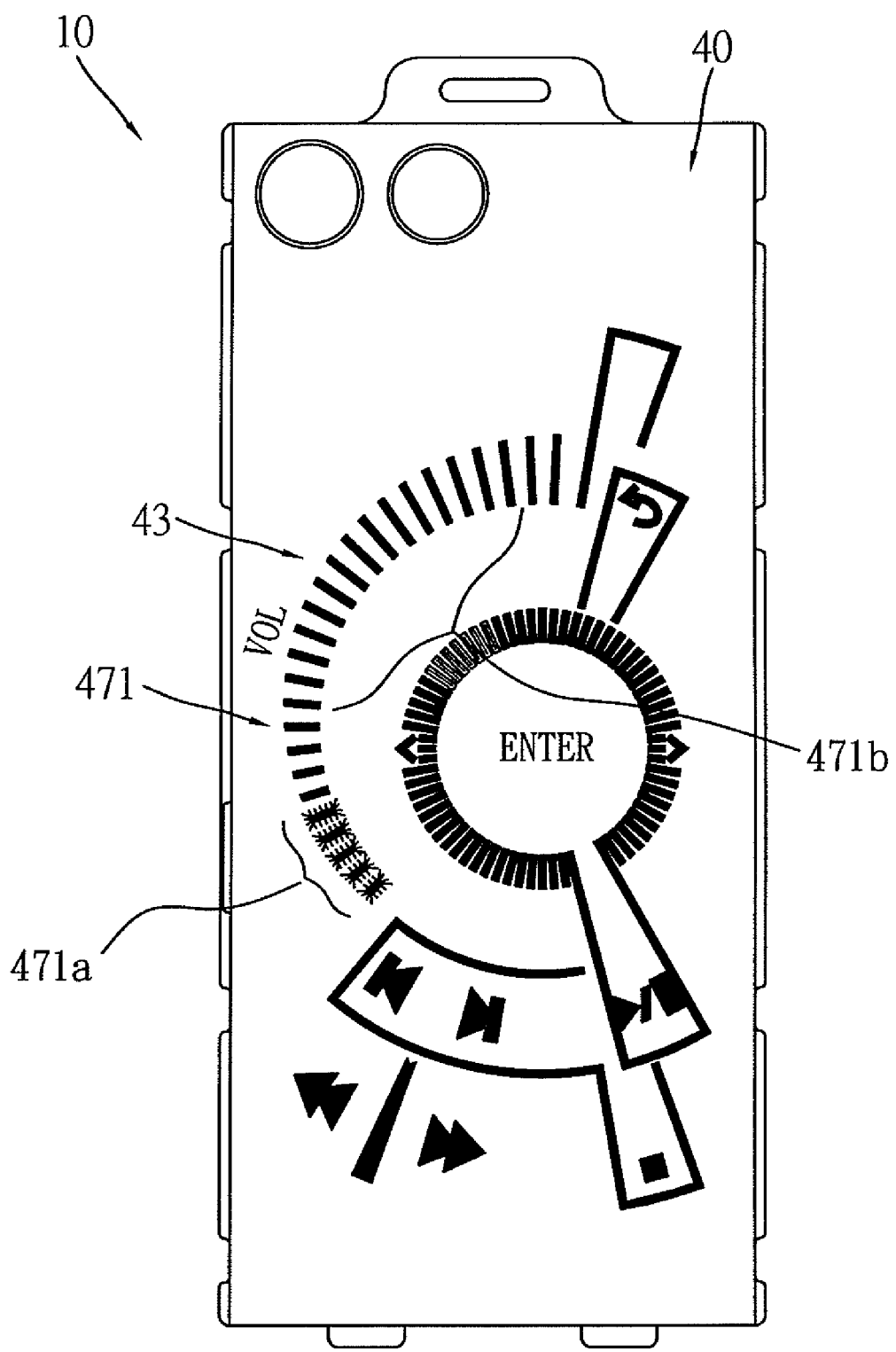
FIG. 9 is another top view drawing of the touchpad interface device according to the present invention.

Please refer to FIG. 9. Assuming the beginning volume level is the minimum, only the lower portion of the scale pattern 471 is illuminated, and the user can judge the level of volume by the number of the illuminated scale patterns 471. For clarity, the illuminated scale patterns are indicated as 471a, and the non-illuminated scale patterns are indicated as 471b. As shown in FIG. 9, the illuminated scale patterns 471a are arranged contiguously, and the non-illuminated scale patterns 471b are also arranged contiguously.

Figure 10:
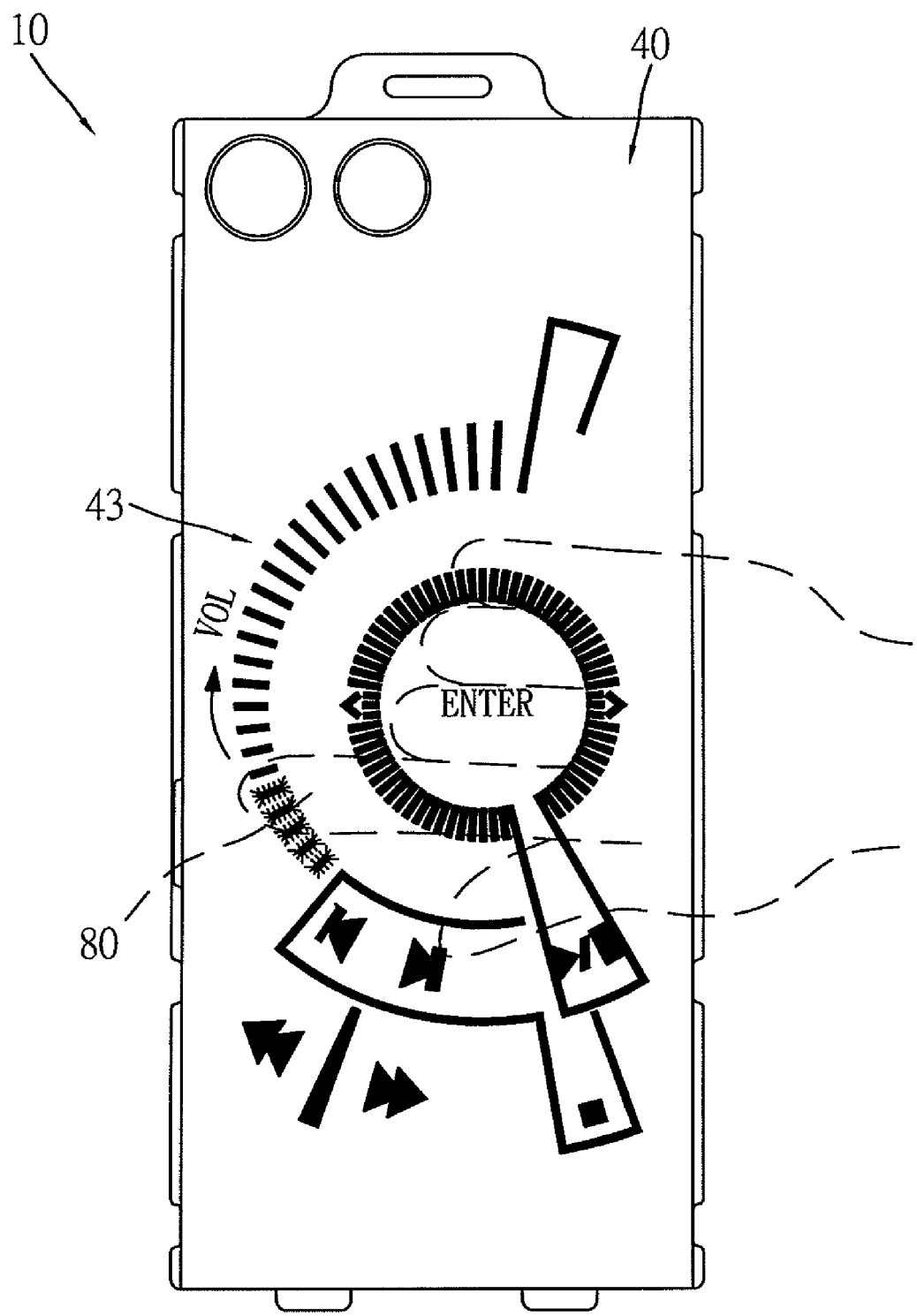
FIGS. 10 to 13 are schematic drawings of the user touching the volume adjusting area with his or her finger.
Figure 11:
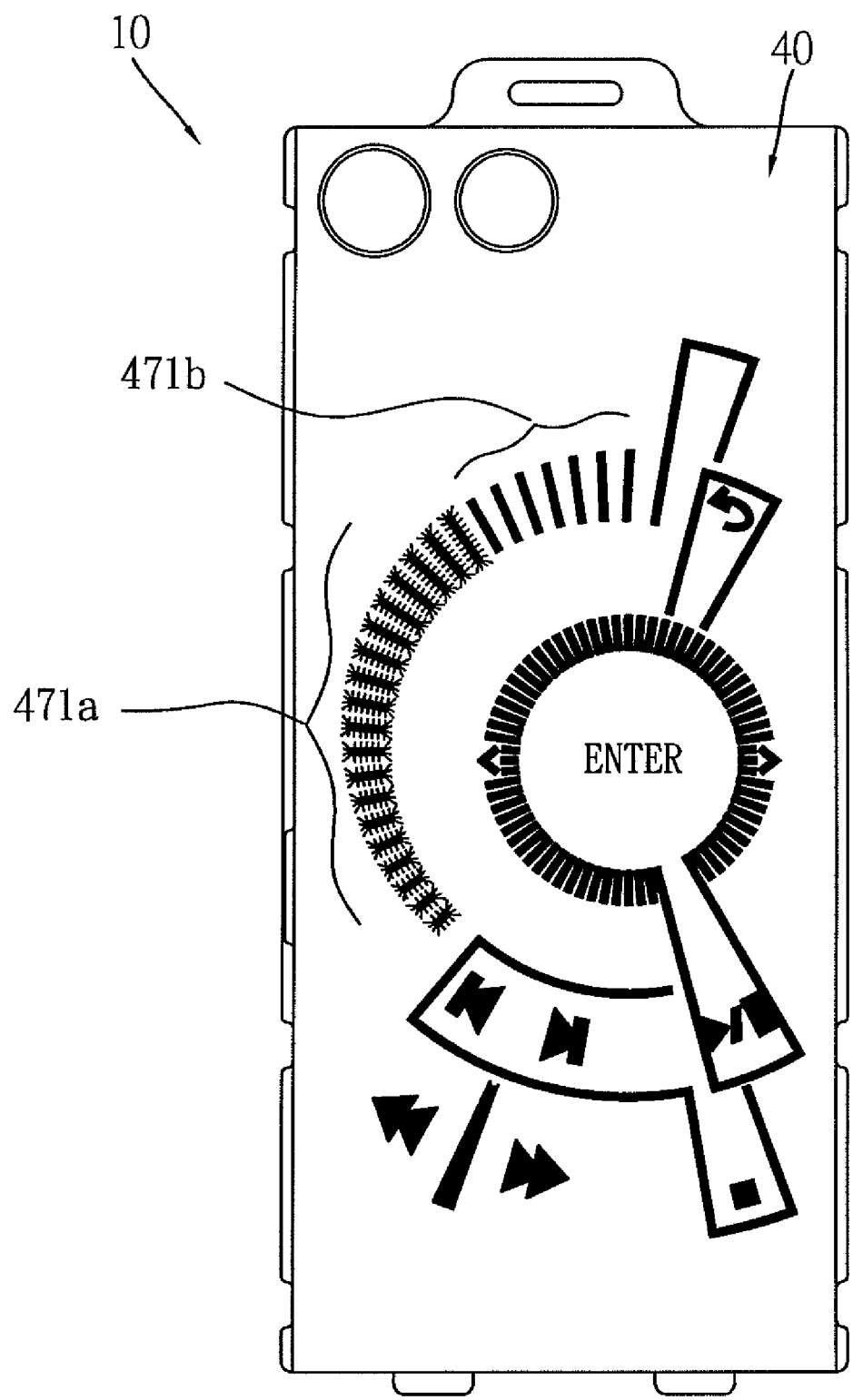

Please refer to FIG. 10. When the user uses his/her finger 80 to touch the volume adjusting area 43 on the control panel 40 and moves along the arc-shaped arranged scale patterns 471 upward, the light displayed on the volume adjusting area 43 moves simultaneously with the user's finger 80, and the volume is also changed correspondingly. As shown in FIG. 11, the number of the illuminated scale patterns 471a is increased, and the number of the non-illuminated scale patterns 471b is decreased. If the user's finger 80 first touches the illuminated scale patterns 471a and then moves to the non-illuminated scale patterns 471b, the playing volume is turned up more, and the number of the illuminated scale patterns 471a is increased.

Figure 12:
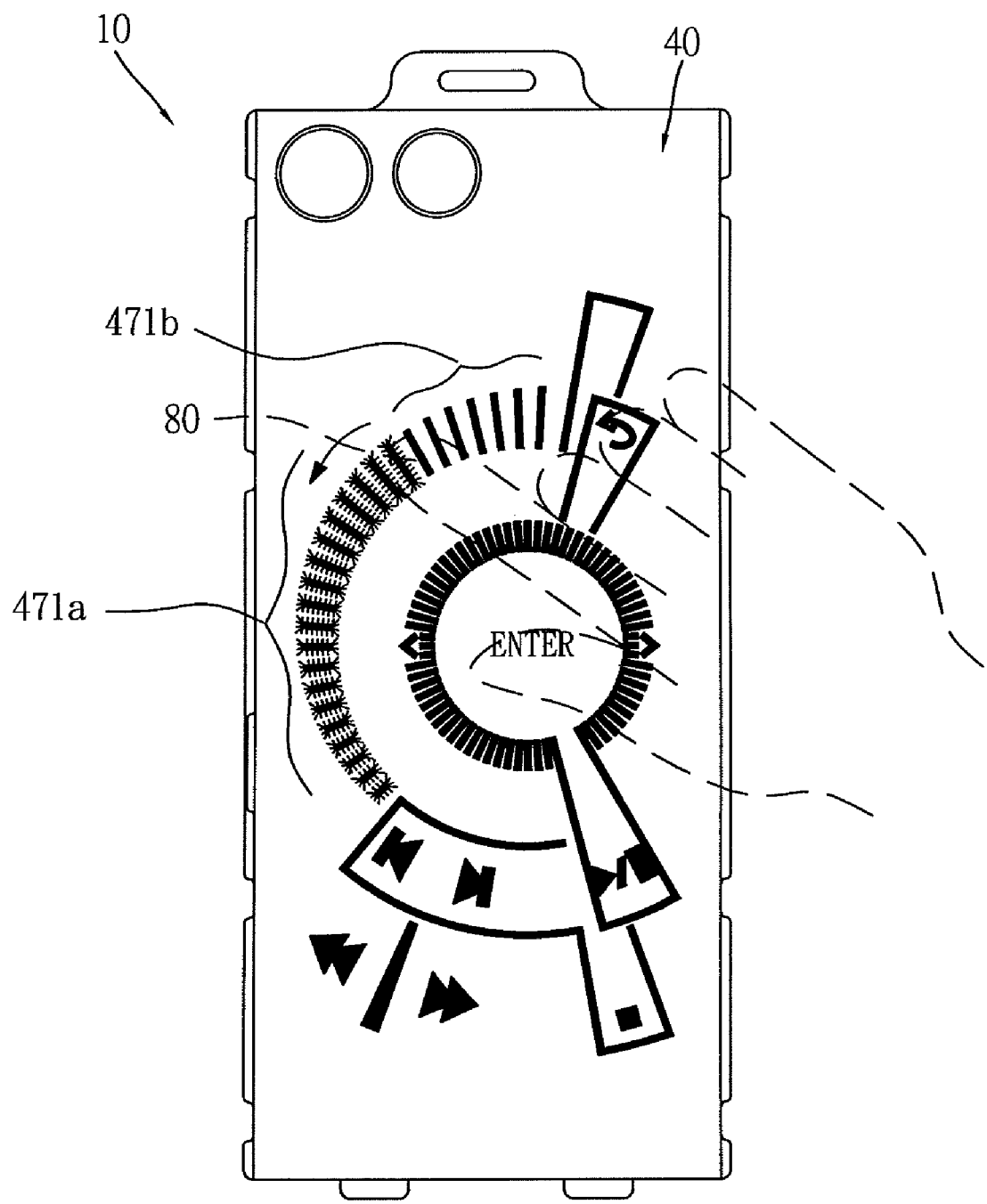
Figure 13:
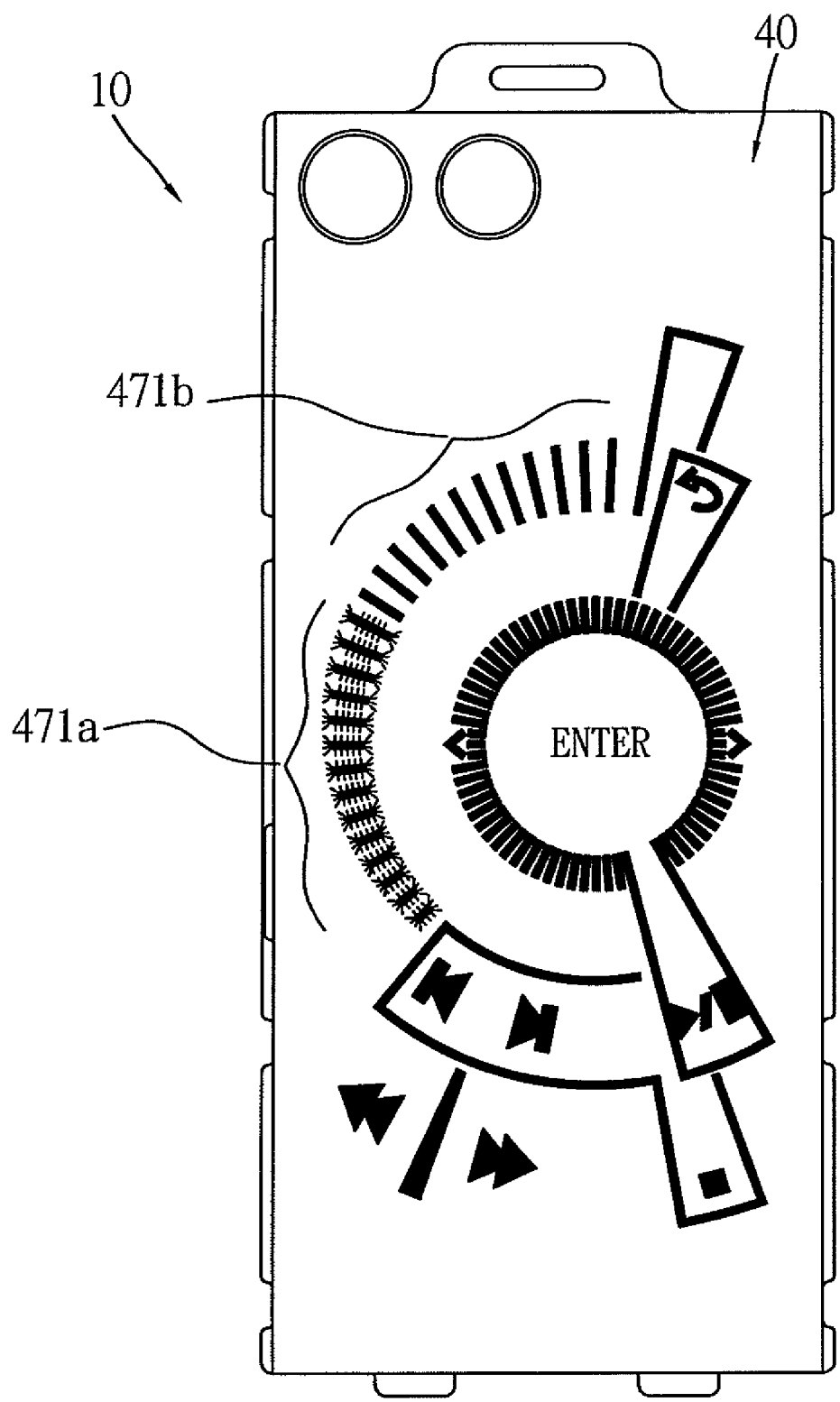

Please refer to FIG. 12. When the user wants to turn down the volume, the user uses the finger 80 to touch the volume adjusting area 43 on the control panel 40 and moves along the arc-shaped arranged scale patterns 471 downward. As shown in FIG. 13, the number of the illuminated scale patterns 471a is decreased, and the number of the non-illuminated scale patterns 471b is increased. If the user's finger 80 first touches the non-illuminated scale patterns 471b and then moves to the illuminated scale patterns 471a, the playing volume is turned down further, and the number of the illuminated scale patterns 471a is decreased.

FIG. 10 to FIG. 13 illustrate that when the user uses the finger 80 to touch the volume adjusting area 43 on the control panel 40 and moves along the arc-shaped arranged scale patterns 471 upward or downward, the number of the illuminated scale patterns 471 simultaneously increases or decreases. Therefore, the user can be aware of the level of the volume according to the scale pattern 471.

Figure 14:
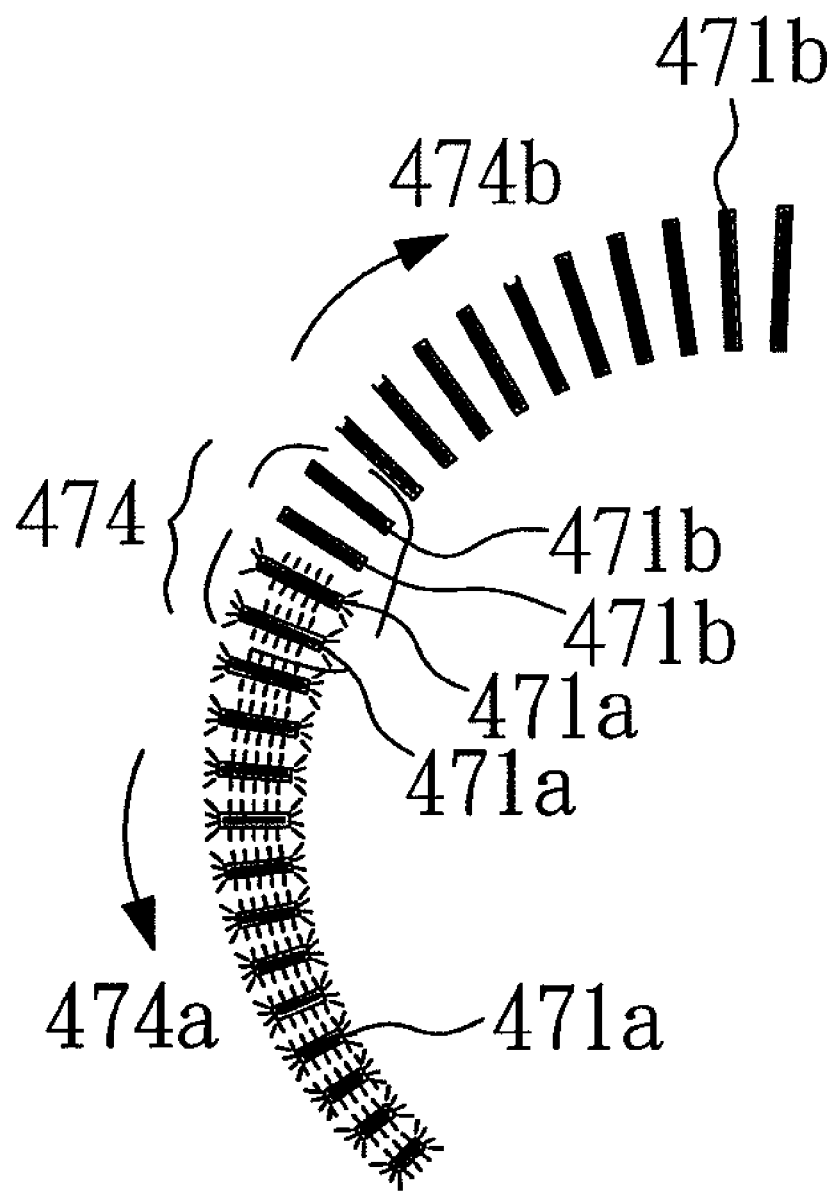
FIG. 14 is a schematic drawing of an adjusting area according to the present invention.

Please refer to FIG. 14. In order to provide convenience for the user, when the user uses his/her finger to touch the scale pattern 471 to adjust the volume level, it can be limited such that the user's finger must first touch the adjusting area 474 for adjustment to take place. In other words, movement either in the direction 474b, toward the non-illuminated scale patterns 471b, or in the direction 474a, toward the illuminated scale patterns 471a, must begin in the adjusting area 474. The adjusting area 474 is defined as the area between the illuminated scale patterns 471a and the non-illuminated scale patterns 471b. When the user uses his/her finger to touch the adjusting area 474 and then moves the finger to the non-illuminated scale patterns 471b, the adjusting signal increases both the volume output and the number of the illuminated scale patterns 471a, with a corresponding decrease in the number of the non-illuminated scale patterns 471b. If the user first touches the adjusting area 474 and then moves the finger to the illuminated scale patterns 471a, the adjusting signal decreases both the level of the volume output and the number of the illuminated scale patterns 471a, with a corresponding increase in the number of the non-illuminated scale patterns 471b.

Figure 15:
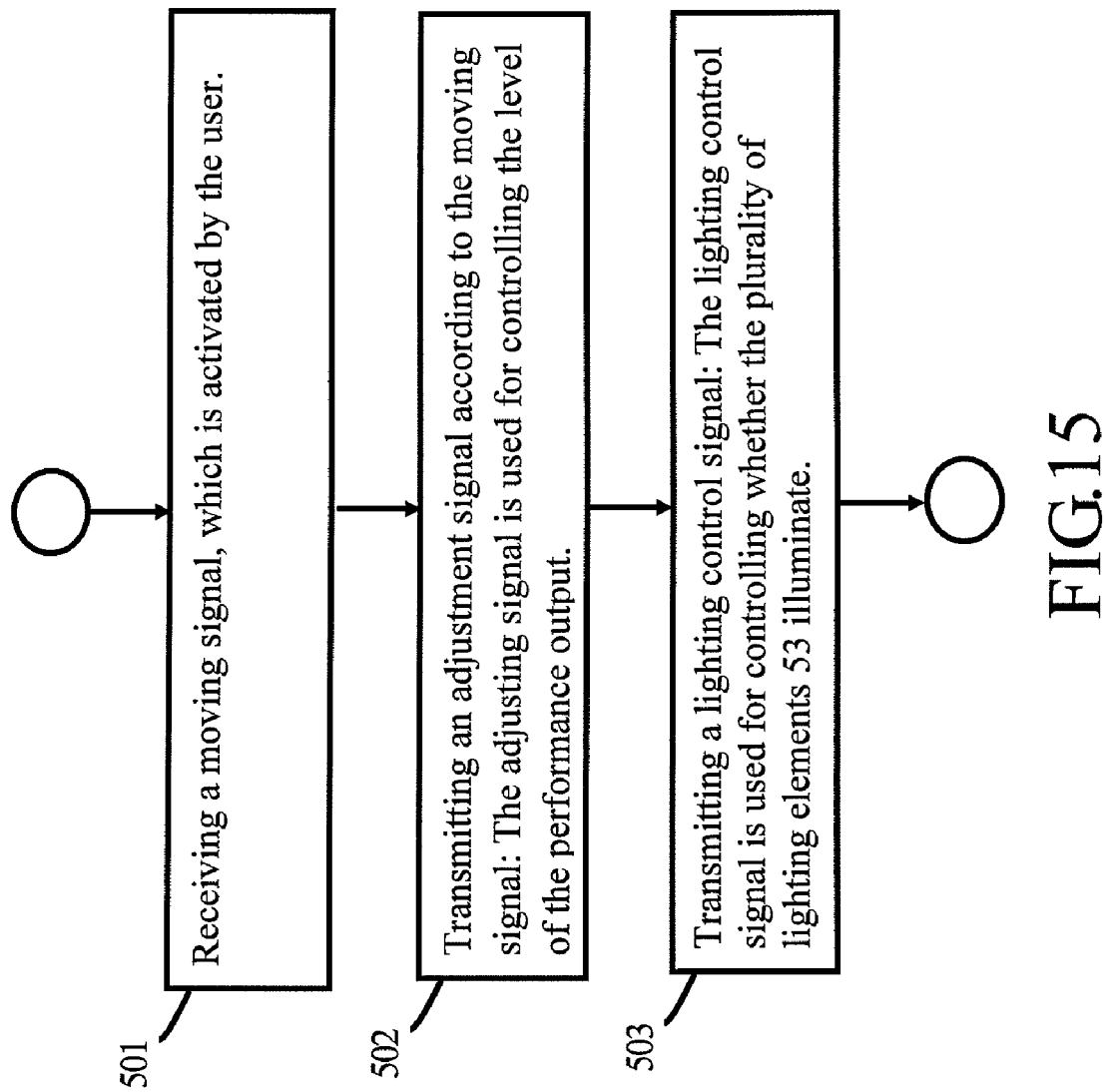
FIG. 15 is a flow chart of the volume adjustment process of the portable computer according to the present invention.

In order to achieve the effect shown in FIG. 10 to FIG. 14, a multimedia operation interface control program 932 needs to be executed. The following description explains the flowchart of the volume adjustment process, as shown in FIG. 15.

Step 501:

Receiving a moving signal, which is activated by the user.

The moving signal is generated, as shown in FIG. 10 or FIG. 12, when the user is moving his or her finger 80 in the volume adjusting area 43. The volume sensing area 211 of the sensing board 20 detects the movement of finger 80. Consequently, the sensing board 20 transmits the moving signal to the processor 92.

Step 502:

Transmitting an adjustment signal according to the moving signal. The adjusting signal is used for controlling the level of the performance output. The performance output can be the volume output as described in this embodiment, screen brightness output, screen color fullness, etc.

The processor 92 transmits an adjustment signal according to the moving signal to the speaker 95. The adjustment signal can be an adjustment value for the output volume (such as 80% of the volume output) or a signal for increasing or decreasing the volume.

The moving signal can be a series of coordinate signals, and the coordinate signals are used for determining the request from the user. Furthermore, the moving signal can also determine the request from the user by different volume sensing areas 211 as described in this embodiment. Since the analysis technology for the moving signal is well known to those skilled in the art, no further description is provided.

Please refer to FIG. 14. One way to determine whether the adjusting signal is transmitted is to determine whether the adjusting area 474 has been touched. If it has been touched, the adjusting signal is transmitted to control the level of the performance output. If the user first touches the adjusting area 474 and then moves to the non-illuminated scale patterns 471b, the adjusting signal increases both the level of the performance output and the number of the illuminated scale patterns 471a. If the user first touches the adjusting area 474 and then moves to the illuminated scale patterns 471a, the adjusting signal decreases both the level of the performance output and the number of the illuminated scale patterns 471a.

Step 503:

Transmitting a lighting control signal. The lighting control signal is used for controlling whether the plurality of lighting elements 53 illuminate, with more lighting elements 53 illuminating indicating a higher level of the performance output.

The lighting control signal determines which lighting elements 53 should illuminate basically according to the moving signal so the corresponding scale patterns 471 are illuminated. As in the previous description, the light guide plate 30 introduces the light to the control panel 40 evenly or by a special effect. Therefore, the light guide plate 30 should be placed between the sensing board 20 and the control panel 40.

However, the design of the present invention is an absolute volume design, not the well-known relative volume design. When the user wants to increase the volume, his/her finger moves along the volume adjusting area 43, and the light follows the user's finger and appears on the volume adjusting area 43. When the user's finger moves to any portion of the volume adjusting area 43, the light simultaneously appears on the volume adjusting area 43. Therefore, the absolute volume level required by the user can be indicated by the three dimensional visual effect generated simultaneously such that the user can immediately know the current volume level without fine-tuning.

Although the present invention has been explained in relation to its preferred embodiments, it is to be understood that many other possible modifications and variations can be made without departing from the spirit and scope of the invention as hereinafter claimed.

What is claimed is:

1. A touchpad interface device installed in an electronic device and used as an input interface for a user, the touchpad interface device comprising:
   a control panel having a plurality of transparent areas and a plurality of covering areas forming a plurality of patterns allowing the user to understand an operating functionality of the control panel according to the plurality of patterns, wherein the plurality of pattern comprises a plurality of scale patterns, and wherein the plurality of scale patterns comprises a volume adjusting area;
   a sensing board disposed under the control panel for sensing physical contact, wherein the sensing board has a volume adjustment sensing area corresponding to the volume adjusting area; and
   a plurality of lighting elements disposed under the control panel and corresponding to the volume adjusting area, wherein when the lighting elements illuminate, the scale patterns at the corresponding position are illuminated;
   wherein the plurality of scale patterns are aligned, the illuminated scale patterns are contiguous, and the non-illuminated scale patterns are also contiguous;
   wherein when the user touches the volume adjusting area, the volume adjustment sensing area is activated to control brightness of the plurality of lighting elements, wherein the plurality of scale patterns are illuminated, wherein more scale patterns illuminated indicates volume is at a higher level, and the user is made aware of the higher level of the volume by the brightness of the scale pattern, wherein an area between the illuminated scale patterns and the non-illuminated scale patterns is defined as an adjusting area; wherein if the physical contact first occurs in the adjusting area and then moves in the direction of the non-illuminated scale patterns, the volume is increased and the number of illuminated scale patterns increases; and wherein if the physical contact first occurs in the adjusting area and then moves in the direction of the illuminated scale patterns, the volume is decreased and the number of illuminated scale patterns decreases.

2. A touchpad interface device installed in an electronic device and used as an input interface for a user, the touchpad interface device comprising:
   a control panel having a plurality of transparent areas and a plurality of covering areas forming a plurality of patterns allowing the user to understand an operating functionality of the control panel according to the plurality of patterns, wherein the plurality of pattern comprises a plurality of scale patterns, and wherein the plurality of scale patterns comprises a volume adjusting area;
   a sensing board disposed under the control panel for sensing physical contact, wherein the sensing board has a volume adjustment sensing area corresponding to the volume adjusting area; and
   a plurality of lighting elements disposed under the control panel and corresponding to the volume adjusting area, wherein when the lighting elements illuminate, the scale patterns at the corresponding position are illuminated;
   wherein the plurality of scale patterns are aligned, the illuminated scale patterns are contiguous, and the non-illuminated scale patterns are also contiguous;
   wherein when the user touches the volume adjusting area, the volume adjustment sensing area is activated to control brightness of the plurality of lighting elements, wherein the plurality of scale patterns are illuminated, wherein more scale patterns illuminated indicates volume is at a higher level, and the user is made aware of the higher level of the volume by the brightness of the scale pattern, wherein when the user first touches the illuminated scale patterns and then moves to the non-illuminated scale patterns, the volume is increased, and the number of the illuminated scale patterns increases; and wherein when the user first touches the non-illuminated scale patterns and then moves to the illuminated scale patterns, the volume is decreased, and the number of the illuminated scale patterns decreases.

3. The touchpad interface device as claimed in claim 2 further comprising a light guide plate disposed between the control panel and the sensing board, wherein the light guide plate has a plurality of light emitting faces corresponding to the volume adjusting area, and wherein an interference slit is disposed between each light emitting face.

4. The touchpad interface device as claimed in claim 3, wherein the control panel has an inner surface and an outer surface, wherein the plurality of covering areas has a plurality of first cover layers and a plurality of second cover layers, wherein the plurality of first cover layers is disposed on the inner surface, and wherein the plurality of second cover layers is disposed on the outer surface.

5. The touchpad interface device as claimed in claim 4, wherein at least one second cover layer is disposed on at least one corresponding position in the plurality of transparent areas.

6. A portable electronic device having a touchpad interface device used as an input interface for a user, the touchpad interface device comprising:
   a control panel having a plurality of transparent areas and a plurality of covering areas forming a plurality of patterns allowing the user to understand an operating functionality of the control panel according to the plurality of patterns, wherein the plurality of patterns comprise a plurality of scale patterns, and wherein the plurality of scale patterns comprise a volume adjusting area;
   a sensing board disposed under the control panel for sensing physical contact; wherein the sensing board has a volume adjustment sensing area corresponding to the volume adjusting area; and
   a plurality of lighting elements disposed under the control panel and corresponding to the volume adjusting area; wherein when the plurality of lighting elements illuminate, the scale patterns at the corresponding position are illuminated;
   wherein the plurality of scale patterns are aligned, the illuminated scale patterns are contiguous, and the non-illuminated scale patterns are also contiguous;
   wherein when the user touches the volume adjusting area, the volume adjustment sensing area is activated to control brightness of the plurality of lighting elements, wherein the plurality of scale patterns are illuminated; wherein more scale patterns illuminated indicates volume is at a higher level, and the user is made aware of the higher level of the volume by the brightness of the scale pattern, wherein an area between the illuminated scale patterns and the non-illuminated scale patterns is defined as an adjusting area; wherein if the physical contact first occurs in the adjusting area and then moves in the direction of the non-illuminated scale patterns, the volume is turned up, and the number of illuminated scale patterns increases; and wherein if the physical contact first occurs in the adjusting area and then moves in the direction of the illuminated scale patterns, the volume is decreased, and the number of illuminated scale patterns decreases.

7. The portable electronic device as claimed in claim 6, wherein the portable electronic device is a portable computer which has a computer keyboard, and wherein the touchpad interface device is disposed next to the computer keyboard.

8. A portable electronic device having a touchpad interface device used as an input interface for a user, the touchpad interface device comprising:
- a control panel having a plurality of transparent areas and a plurality of covering areas forming a plurality of patterns allowing the user to understand an operating functionality of the control panel according to the plurality of patterns, wherein the plurality of patterns comprise a plurality of scale patterns, and wherein the plurality of scale patterns comprise a volume adjusting area;
- a sensing board disposed under the control panel for sensing physical contact; wherein the sensing board has a volume adjustment sensing area corresponding to the volume adjusting area; and
- a plurality of lighting elements disposed under the control panel and corresponding to the volume adjusting area; wherein when the plurality of lighting elements illuminate, the scale patterns at the corresponding position are illuminated;
- wherein the plurality of scale patterns are aligned, the illuminated scale patterns are contiguous, and the non-illuminated scale patterns are also contiguous;
- wherein when the user touches the volume adjusting area, the volume adjustment sensing area is activated to control brightness of the plurality of lighting elements, wherein the plurality of scale patterns are illuminated; wherein more scale patterns illuminated indicates volume is at a higher level, and the user is made aware of the higher level of the volume by the brightness of the scale pattern, wherein when the user first touches the illuminated scale patterns and then moves the finger to the non-illuminated scale patterns, the volume is increased, and the number of the illuminated scale patterns increases; and wherein when the user first touches the non-illuminated scale patterns and then moves the finger to the illuminated scale patterns, the volume is decreased, and the number of the illuminated scale patterns decreases.

9. The portable electronic device as claimed in claim 8 further comprising a light guide plate disposed between the control panel and the sensing board, wherein the light guide plate has a plurality of light emitting faces corresponding to the volume adjusting area, and wherein an interference slit is disposed between each light emitting face.

10. The portable electronic device as claimed in claim 9, wherein the control panel further comprises a player control area, wherein the sensing board has a player control sensing area corresponding to the player control area, and wherein the light guide plate comprises a first light guide plate and a second light guide plate; wherein the first light guide plate is disposed corresponding to the volume adjusting area, the second light guide plate is disposed corresponding to the player control area, and a gap exists between the first light guide plate and the second light guide plate in order to prevent light interference.

11. The portable electronic device as claimed in claim 10, wherein the control panel has an inner surface and an outer surface, wherein the plurality of covering areas has a plurality of first cover layers and a plurality of second cover layers, wherein the plurality of first cover layers is disposed on the inner surface, wherein the plurality of second cover layers is disposed on the outer surface, and wherein at least one second cover layer is disposed on at least one corresponding position in the plurality of transparent areas.

12. A portable electronic device having a touchpad interface device used as an input interface for a user, the touchpad interface device comprising:
- a control panel comprising a volume adjusting area and a player control area, wherein the volume adjusting area and the player control area comprise a plurality of transparent areas and a plurality of covering areas forming a plurality of patterns allowing the user to understand an operating functionality of the control panel according to the plurality of patterns;
- a light guide plate disposed under the control panel;
- a sensing board disposed under the control panel for sensing physical contact; wherein the sensing board has a volume adjustment sensing area corresponding to the volume adjusting area and a player control sensing area corresponding to the player control area; and
- a plurality of lighting elements disposed under the control panel, with the light guide plate guiding light from the plurality of lighting elements to the control panel;
- wherein the plurality of patterns comprise the plurality of scale patterns, wherein the plurality of scale patterns are located in the volume adjusting area, and wherein the plurality of lighting elements is disposed corresponding to the volume adjusting area wherein when the lighting elements corresponding to the volume adjusting area illuminate, the scale patterns at the corresponding position are illuminated;
- wherein when the user touches the volume adjusting area, the volume adjustment sensing area is activated to control brightness of the lighting element and the plurality of scale patterns are illuminated, wherein more scale patterns illuminated indicates volume is at a higher level, and the user is made aware of the higher level of the volume by the brightness of the scale pattern;
- wherein the plurality of scale patterns are aligned, the illuminated scale patterns are contiguous, and wherein the non-illuminated scale patterns are also contiguous, wherein an area between the illuminated scale patterns and the non-illuminated scale patterns is defined as an adjusting area; wherein if the physical contact first occurs in the adjusting area and then moves in the direction of the non-illuminated scale patterns, the volume is turned up, and the number of illuminated scale patterns increases; and wherein if the physical contact first occurs in the adjusting area and then moves in the direction of the illuminated scale patterns, the volume is decreased, and the number of illuminated scale patterns decreases.

13. The portable electronic device as claimed in claim 12, wherein the portable electronic device is a portable computer which has a computer keyboard, and wherein the touchpad interface device is disposed next to the computer keyboard.

14. A portable electronic device having a touchpad interface device used as an input interface for a user, the touchpad interface device comprising:

a control panel comprising a volume adjusting area and a player control area, wherein the volume adjusting area and the player control area comprise a plurality of transparent areas and a plurality of covering areas forming a plurality of patterns allowing the user to understand an operating functionality of the control panel according to the plurality of patterns;

a light guide plate disposed under the control panel;

a sensing board disposed under the control panel for sensing physical contact; wherein the sensing board has a volume adjustment sensing area corresponding to the volume adjusting area and a player control sensing area corresponding to the player control area; and a plurality of lighting elements disposed under the control panel, with the light guide plate guiding light from the plurality of lighting elements to the control panel;

wherein the plurality of patterns comprise the plurality of scale patterns, wherein the plurality of scale patterns are located in the volume adjusting area, and wherein the plurality of lighting elements is disposed corresponding to the volume adjusting area wherein when the lighting elements corresponding to the volume adjusting area illuminate, the scale patterns at the corresponding position are illuminated;

wherein when the user touches the volume adjusting area, the volume adjustment sensing area is activated to control brightness of the lighting element and the plurality of scale patterns are illuminated, wherein more scale patterns illuminated indicates volume is at a higher level, and the user is made aware of the higher level of the volume by the brightness of the scale pattern;

wherein the plurality of scale patterns are aligned, the illuminated scale patterns are contiguous, and wherein the non-illuminated scale patterns are also contiguous, wherein when the user first touches the illuminated scale patterns and then moves the finger to the non-illuminated scale patterns, the volume is increased, and the number of the illuminated scale patterns increases; and wherein when the user first touches the non-illuminated scale patterns and then moves the finger to the illuminated scale patterns, the volume is decreased, and the number of the illuminated scale patterns decreases.

15. The portable electronic device as claimed in claim 14, wherein the light guide plate has a plurality of light emitting faces corresponding to the volume adjusting area, and wherein an interference slit is disposed between each light emitting face.

16. The portable electronic device as claimed in claim 15, wherein the light guide plate comprises a first light guide plate and a second light guide plate; wherein the first light guide plate is disposed corresponding to the volume adjusting area, wherein the second light guide plate is disposed corresponding to the player control area, and wherein a gap exists between the first light guide plate and the second light guide plate in order to prevent light interference.

17. The portable electronic device as claimed in claim 16, wherein the control panel has an inner surface and an outer surface, and wherein the plurality of covering areas has a plurality of first cover layers and a plurality of second cover layers, wherein the plurality of first cover layers is disposed on the inner surface, and the plurality of second cover layers is disposed on the outer surface, and wherein at least one second cover layer is disposed on at least one corresponding position in the transparent areas.

18. The portable electronic device as claimed in claim 14, wherein the portable electronic device is a portable computer which has a computer keyboard, and wherein the touchpad interface device is disposed next to the computer keyboard.

19. The portable electronic device as claimed in claim 8, wherein the portable electronic device is a portable computer which has a computer keyboard, and wherein the touchpad interface device is disposed next to the computer keyboard.

\* \* \* \* \*